(12) United States Patent
Yang et al.

(10) Patent No.: US 9,030,090 B2
(45) Date of Patent: May 12, 2015

(54) LIGHT EMITTING DIODE WITH IMPROVED LIGHT EXTRACTION EFFICIENCY

(75) Inventors: Jeong Hee Yang, Ansan-si (KR); Kyoung Wan Kim, Ansan-si (KR); Yeo Jin Yoon, Ansan-si (KR); Jae Moo Kim, Ansan-si (KR); Keum Ju Lee, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 88 days.

(21) Appl. No.: 13/816,572

(22) PCT Filed: Feb. 19, 2011

(86) PCT No.: PCT/KR2011/001105
§ 371 (c)(1),
(2), (4) Date: Feb. 12, 2013

(87) PCT Pub. No.: WO2012/020901
PCT Pub. Date: Feb. 16, 2012

(65) Prior Publication Data
US 2013/0134867 A1    May 30, 2013

(30) Foreign Application Priority Data

Aug. 12, 2010 (KR) .................. 10-2010-0077924

(51) Int. Cl.
| H01J 63/04 | (2006.01) |
| H05B 33/06 | (2006.01) |
| H01L 33/38 | (2010.01) |
| H01L 33/46 | (2010.01) |
| H01L 33/20 | (2010.01) |

(52) U.S. Cl.
CPC ............... *H05B 33/06* (2013.01); *H01L 33/38* (2013.01); *H01L 33/46* (2013.01); *H01L 33/20* (2013.01)

(58) Field of Classification Search
CPC ..................................................... H05B 33/06
USPC ............................................. 313/499
See application file for complete search history.

(56) References Cited

U.S. PATENT DOCUMENTS

| 6,650,018 | B1 | 11/2003 | Zhao et al. | |
| 2005/0116235 | A1* | 6/2005 | Schultz et al. | 257/79 |
| 2006/0063288 | A1 | 3/2006 | Liu | |
| 2010/0044734 | A1* | 2/2010 | Seko et al. | 257/98 |
| 2011/0227109 | A1* | 9/2011 | Kim et al. | 257/98 |

FOREIGN PATENT DOCUMENTS

| JP | 09-129921 | 5/1997 |
| JP | 2001-085738 | 3/2001 |
| JP | 2005-019646 | 1/2005 |
| JP | 2007-220970 | 8/2007 |
| JP | 2008-192710 | 8/2008 |
| JP | 2008-218878 | 9/2008 |
| JP | 2009-88481 | 4/2009 |

OTHER PUBLICATIONS

English translation of Takeshi et al., (Jan. 2005).*
International Search Report of PCT/KR2011/001105 mailed Oct. 26, 2011.
Written Opinion of PCT/KR2011/001105 mailed Oct. 26, 2011.

* cited by examiner

*Primary Examiner* — Anh Mai
*Assistant Examiner* — Hana Featherly
(74) *Attorney, Agent, or Firm* — H.C. Park & Associates, PLC

(57) ABSTRACT

Disclosed is a light emitting diode (LED) having improved light extraction efficiency. The LED includes a light emitting structure which is positioned on a substrate and has a first conductive type semiconductor layer, an active layer and a second conductive type semiconductor layer. A first electrode pad is electrically connected to the first conductive type semiconductor layer. A second electrode pad is positioned on the substrate. An insulating reflective layer covers a portion of the light emitting structure, and is positioned under the second electrode pad, so that the second electrode pad is spaced apart from the light emitting structure. At least one upper extension is connected to the second electrode pad to be electrically connected to the second conductive type semiconductor layer. Further, a pattern of light extraction elements is positioned on the second conductive type semiconductor layer.

12 Claims, 4 Drawing Sheets

LIGHT EMITTING DIODE WITH IMPROVED LIGHT EXTRACTION EFFICIENCY

CROSS-REFERENCE TO RELATED APPLICATIONS

This application is the National Stage Entry of International Application No. PCT/KR2011/001105, filed on Feb. 19, 2011, and claims priority from and the benefit of Korean Patent Application No. 10-2010-0077924, filed on Aug. 12, 2010, which are hereby incorporated by reference for all purposes as if fully set forth herein.

BACKGROUND

1. Field

The present invention relates to a light emitting diode, and more particularly, to a light emitting diode with improved light extraction efficiency.

2. Discussion of the Background

Since the development of gallium nitride (GaN)-based light emitting diodes (LEDs), the GaN-based LEDs are currently used in a variety of applications such as full-color LED displays, LED traffic lights and white LEDs.

A GaN-based LED is generally formed by growing epitaxial layers on a substrate such as a sapphire substrate, and includes an N-type semiconductor layer, a P-type semiconductor layer and an active layer interposed therebetween. Meanwhile, an N-electrode pad is formed on the N-type semiconductor layer, and a P-electrode pad is formed on the P-type semiconductor layer. The LED is driven by being electrically connected to an external power source through the electrode pads. In this case, current flows from the P-electrode pad to the N-electrode pad via the semiconductor layers.

Since the P-type semiconductor layer generally has a high resistivity, current is not uniformly distributed in the P-type semiconductor layer but concentrated on a portion at which the P-electrode pad is formed. In addition, the current concentratedly flows through an edge of the LED. The current crowding leads to reduction of a light emitting area, and it results in a lower luminous efficiency. In order to solve such a problem, there is used a technique for spreading current by forming a transparent electrode layer with low resistivity on a P-type semiconductor layer. Since current introduced from a P-electrode pad is spread in the transparent electrode layer and then introduced into the P-type semiconductor layer, the light emitting area of an LED can be extended. However, since the transparent electrode layer absorbs light, its thickness is limited, and therefore, there is a limitation in current spreading. Particularly, there is a limitation in current distribution using a transparent electrode layer in a large-sized LED of is about 1 mm$^2$ or more, which is used for high power.

Meanwhile, extensions extending from electrode pads are used to help current spreading in an LED. For example, U.S. Pat. No. 6,650,018 discloses that a plurality of extensions extend in opposite direction to each other from electrode contact portions 117, 127, i.e., electrode pads to enhance the current spreading. Although current can be distributed throughout a wide area of an LED by using the plurality of extensions, there exists the current crowding that current is still concentrated on portions at which the electrode pads are positioned.

Further, as the size of the LED is increased, it is highly likely that a defect will occur in the LED. For example, a defect such as a threading dislocation or pin hole provides a path along which current rapidly flows, and thus disturbs the current spreading.

Meanwhile, a patterned sapphire substrate is generally used to improve the light extraction efficiency of an LED. A pattern on the sapphire substrate scatters or reflects light generated in an active layer, so that the light lost by internal total reflection in the LED is reduced, and accordingly, the light extraction efficiency is improved.

It is expected that the light extraction efficiency will be improved using the pattern on the sapphire substrate. However, since the refractive index of a GaN-based compound semiconductor layer is relatively high, it is still likely that light will be lost by the internal total reflection in the LED.

Moreover, since electrode pads are generally formed of a metallic material which absorbs light, the light propagating toward the electrode pads is absorbed and lost by the electrode pads.

Therefore, efforts for improving the light extraction efficiency are continuously required.

SUMMARY

An object of the present invention is to provide an LED having improved light extraction efficiency.

Another object of the present invention is to provide an LED capable of preventing current crowding from occurring in the vicinity of an electrode pad.

A further object of the present invention is to provide a large-area LED capable of uniformly spreading current in the LED.

A still further object of the present invention is to provide an LED allowing light lost due to an electrode pad to be reduced.

According to an aspect of the present invention, there is provided an LED, which includes a substrate; a light emitting structure positioned on the substrate, the light emitting structure having a first conductive type semiconductor layer, an active layer and a is second conductive type semiconductor layer; a first electrode pad electrically connected to the first conductive type semiconductor layer; a second electrode pad positioned over the substrate; an insulating reflective layer covering a portion of the light emitting structure and being positioned under the second electrode pad so that the second electrode pad is spaced apart from the light emitting structure; at least one upper extension connected to the second electrode pad so as to be electrically connected to the second conductive type semiconductor layer; and a pattern of light extraction elements positioned over the second conductive type semiconductor layer.

Since the second electrode pad is spaced apart from the light emitting structure by the insulating reflective layer, it is possible to prevent current from being concentrated around the second electrode pad, thereby improving current spreading performance. Further, the insulating reflective layer reflects light propagating toward the second electrode pad, whereby it is possible to reduce a light loss caused by the second electrode pad. In addition, the pattern of the light extraction elements is disposed on the second conductive type semiconductor layer to be opposite to the substrate, so that light can be easily emitted by the pattern of the light extraction elements, thereby improving light extraction efficiency. The pattern of the light extraction elements may be used, for example, by being combined with a pattern formed on a sapphire substrate.

Although not particularly limited, the first conductive type semiconductor layer is may be an n-type nitride semiconductor layer and the second conductive type semiconductor layer may be a p-type nitride semiconductor layer. In addition, the LED may further include a transparent electrode layer positioned on the p-type nitride semiconductor layer, and the upper extension may be connected to the transparent electrode layer.

In some embodiments, the pattern of the light extraction elements may be formed on the transparent electrode layer. For example, the pattern of the light extraction elements may be formed by patterning an upper portion of the transparent electrode layer.

In the meantime, the LED may further include an insulating layer covering the transparent electrode layer. In this case, the insulating layer may have an opening to expose the transparent electrode layer, and the upper extension may be connected to the transparent electrode layer through the opening.

Further, the opening may be positioned to be spaced apart from the second electrode pad. Accordingly, the upper extension connected to the transparent electrode layer through the opening is connected to the second electrode pad vie a connection portion positioned on the insulating layer. Since the connection portion is positioned on the insulating layer, the upper extension does not directly connected to the transparent electrode layer around the second electrode pad, and thus it is possible to further prevent current from being concentrated around the second electrode pad.

In some embodiments, the pattern of the light extraction elements may be formed on the insulating layer. For example, the pattern of the light extraction elements may be formed by patterning an upper portion of the insulating layer.

The first conductive type semiconductor layer may have a region exposed by mesa-etching the second conductive type semiconductor layer and the active layer, and the second electrode pad may be positioned on the exposed region of the first conductive type semiconductor layer. The insulating reflective layer may be positioned between the second electrode pad and the first conductive type semiconductor layer. Accordingly, it is possible to prevent light from being unnecessarily generated under the second electrode pad.

The insulating reflective layer may cover at least a portion of side surfaces of the second conductive type semiconductor layer and the active layer, which are exposed by the mesa etching. Thus, the insulating reflective layer can reflect light generated in the active layer to propagate toward the second electrode pad through the mesa side surfaces, thereby preventing a light loss caused by the second electrode pad.

In the meantime, the LED may further include a connection portion to connect the upper extension and the second electrode pad, and the connection portion may be spaced apart from the second conductive type semiconductor layer by the insulating layer. For example, the connection portion may be insulated from the mesa side surfaces by the insulating reflective layer. Further, the connection portion may be insulated from an upper surface of the second conductive type semiconductor layer (or the transparent electrode layer) by another insulating layer.

In some embodiments, the second conductive type semiconductor layer and the active layer may be divided to define at least two light emitting areas, and the upper extensions connected to the second electrode pad may be positioned on the at least two light emitting areas, respectively.

The light emitting structure is divided into a plurality of light emitting areas, so that although a defect such as pin hole or threading dislocation exists at a specific position, it is possible to prevent current from being excessively concentrated on the defect. Thus, it is possible to uniformly spread current throughout a wide area.

The at least two light emitting areas may be symmetric with respect to a straight line crossing the first and second electrode pads. Accordingly, the at least two light emitting areas can have the same light emitting characteristic.

Further, the LED may further include at least one lower extension connected to the first electrode pad. Furthermore, the at least one lower extension may be positioned between the at least two light emitting areas.

In a conventional LED, the second electrode pad is positioned on the second is conductive type semiconductor layer, and electrically connected to the second conductive type semiconductor layer. Therefore, current is concentrated around the second electrode pad, so that current spreading is interrupted. However, according to the embodiments of the present invention, since the second electrode pad is insulated from the light emitting structure by the insulating reflective layer, it is possible to prevent current from being concentrated around the electrode pad. Further, the second electrode pad is formed in a portion where the second conductive type semiconductor layer and the active layer in the light emitting structure are removed by mesa-etching, so that it is possible to prevent light from being unnecessarily generated under the second electrode pad, thereby improving light emitting efficiency. In addition, the light emitting structure is divided into a plurality of light emitting areas, so that current is prevented from being excessively concentrated on crystal defects in the light emitting areas to thereby uniformly spread current. Furthermore, the pattern of light extraction elements is arranged on the light emitting structure, so that the light extraction efficiency can be more improved.

DETAILED DESCRIPTION OF THE ILLUSTRATED EMBODIMENTS

Figure 1:
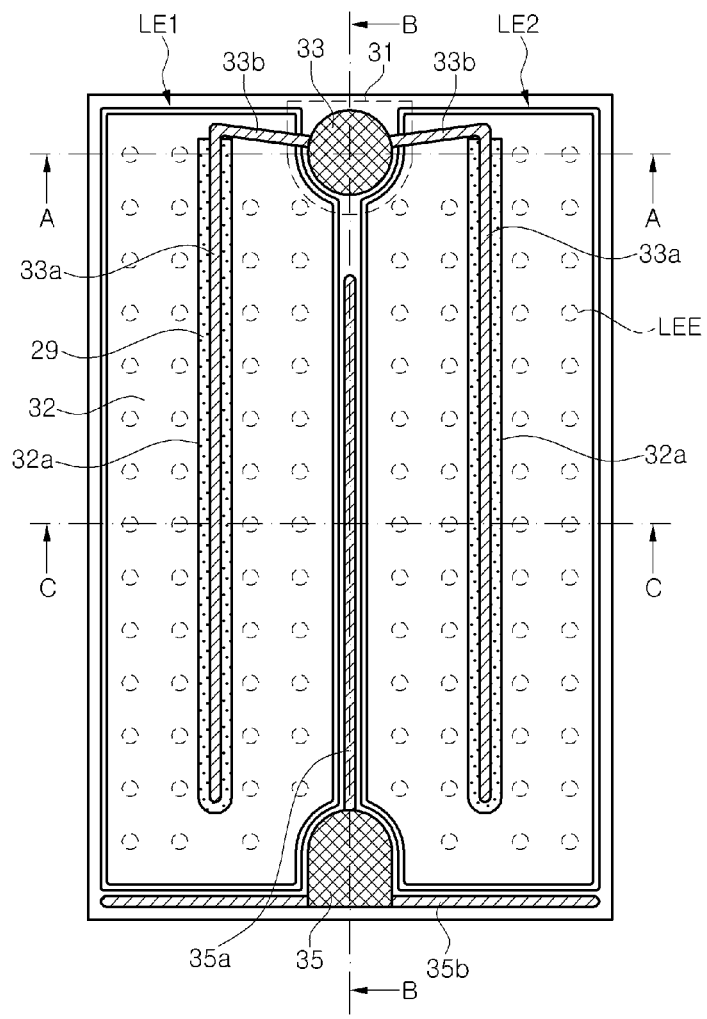
FIG. 1 is a plan view illustrating an LED according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2A:
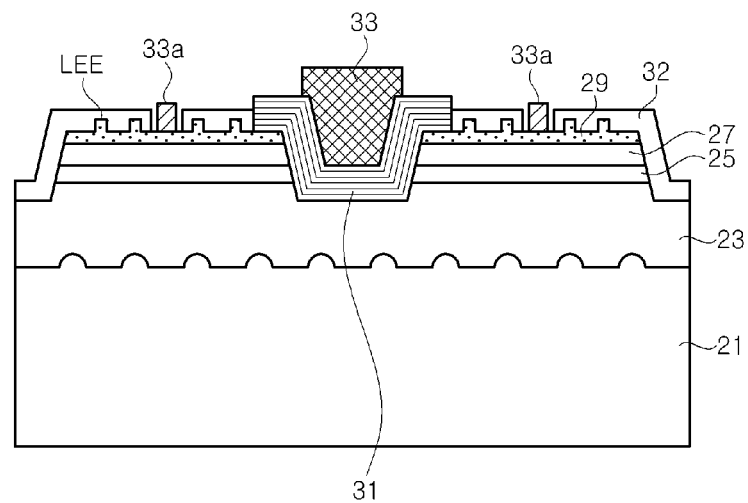
FIGS. 2a to 2c are sectional views taken along lines A-A, B-B and C-C of FIG. 1, respectively.
Figure 2B:
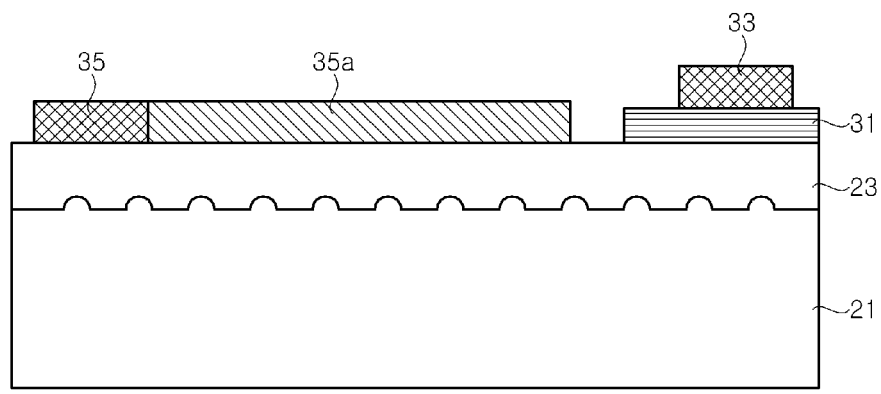
Figure 2C:
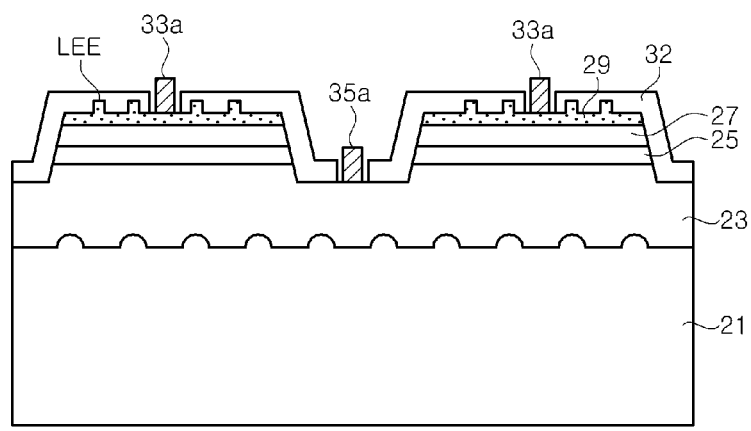

FIG. 1 is a plan view illustrating an LED according to an embodiment of the present invention, and FIGS. 2a to 2c are sectional views taken along lines A-A, B-B and C-C of FIG. 1, respectively.

Referring to FIGS. 1 and 2a to 2c, the LED includes a substrate 21, a light emitting structure having light emitting areas LE1 and LE2, an insulating reflective layer 31, a first electrode pad 35, a second electrode pad 33, and upper extensions 33a. The LED may further include a transparent electrode layer 29, an insulating layer 32, connections 33b, a first lower extension 35a and a second lower extension 35b. The light emitting structure includes a first conductive type semiconductor layer 23, an active layer 25 and a second conductive type semiconductor layer 27.

The substrate 21 may be a patterned sapphire substrate, but the present invention is not limited thereto. The first conductive type semiconductor layer 23 is positioned on the substrate 21, and the second conductive type semiconductor layer 27 is positioned on the first conductive type semiconductor layer 23. The active layer 25 is interposed between the first and second conductive type semiconductor layers. The first conductive type semiconductor layer 23, the active layer 25 and the second conductive type semiconductor layer 27 may be formed of a GaN-based compound semiconductor material, i.e., (Al, In, Ga)N. The composition elements of the active layer 25 and the composition ratio thereof are determined so as to emit light of a is required wavelength, e.g., ultraviolet light or blue light.

The first conductive type semiconductor layer 23 may be an n-type nitride semiconductor layer and the second conductive type semiconductor layer 27 may be a p-type nitride semiconductor layer, or vice versa.

The first conductive type semiconductor layer 23 and/or the second conductive type semiconductor layer 27 may be not formed to have a single-layered structure, as shown in the figures, or a multi-layered structure. The active layer 25 may have a single or multiple quantum well structure. A buffer layer (not shown) may be interposed between the substrate 21 and the first conductive type semiconductor layer 23. The semiconductor layers 23, 25 and 27 may be formed using a metal-organic chemical vapor deposition (MOCVD) or molecular beam epitaxy (MBE) technique.

The second conductive type semiconductor layer 27 and the active layer 25 in the light emitting structure may be divided so as to define at least two light emitting areas LE1 and LE2. The light emitting areas LE1 and LE2 may be formed to have a symmetrical structure, and such a dividing process may be performed by a mesa etching process. The first conductive type semiconductor layer 23 in the region crossing a center of the light emitting structure is exposed by the mesa etching process, so that the second conductive type semiconductor layer 27 and active layer 25 can be divided into two areas. Each side surface of the light emitting structure, is formed by the mesa etching process, may have an inclination angle in a range from 30 to 70 degrees with respect to a surface of the substrate 21.

Meanwhile, the transparent electrode layer 29 may be positioned on the second conductive type semiconductor layer 27. The transparent electrode layer 29 may be formed of indium tin oxide (ITO) or Ni/Au, and is in ohmic contact with the second conductive type semiconductor layer. Patterns of the light extraction elements LEE are positioned on the transparent electrode layer 29. For example, the light extraction elements may be in the shape of a cylinder having a diameter of about 5 μm, and spaced apart from one another at an interval of about 30 μm. When light generated in the active layer 25 propagates toward the transparent electrode layer 29, the light extraction elements can help the emission of the light by scattering or reflecting the light. Although the patterns of the light extraction elements may be regular, the present invention is not limited thereto. That is, the patterns of the light extraction elements may be irregular.

The insulating reflective layer 31 is positioned on the first conductive type semiconductor layer 23 exposed by the mesa etching process. The insulating reflective layer 31 is positioned on a partial region of the light emitting structure, and covers a portion of the mesa side surfaces exposed by the mesa etching. The insulating reflective layer 31 may be formed by alternately stacking material layers having different refractive indices and then pattering them is using a photolithography and etching process, and the layers having different refractive indices may be selected, for example, from $SiO_2$, $Si_3N_4$, $TiO_2$ and $Nb_2O_5$.

The insulating reflective layer 31 may be formed after the transparent electrode layer 29 is formed on the light emitting structure. However, the present invention is not limited thereto. For example, after the insulating reflective layer 31 may be first formed, the transparent electrode layer 29 may be formed.

Meanwhile, the insulating layer 32 may cover the second conductive type semiconductor layer 27 (or the transparent electrode layer 29) of the light emitting structure. The insulating layer 32 may also cover side surfaces of the second conductive type semiconductor layer 27 and the active layer 25, which are exposed by the mesa etching process. Further, the insulating layer 32 has openings 32a for exposing the transparent electrode layer 29 on the respective light emitting areas LE1 and LE2. The transparent electrode layer 29 (or the second conductive type semiconductor layer 27) is exposed through the openings 32a. The insulating layer 32 is not particularly limited as long as it is made of a transparent material through which light generated in the active layer 25 can be transmitted. For example, the insulating layer may be formed of $SiO_2$.

The first electrode pad 35 and the second electrode pad 33 are positioned on the first conductive type semiconductor layer exposed by the mesa etching process. The first is electrode pad 35 is electrically connected to the first conductive type semiconductor layer 23. Meanwhile, the second electrode pad 33 is insulated from the first conductive type semiconductor layer 23 by the insulating layer 31. The first and second electrode pads 35 and 33 are bonding pads to which wires are bonded, and have a relatively wide area so that the wires can be bonded thereto. Although the first and second electrode pads 35 and 33 may be positioned restrictively on the exposed region of the first conductive type semiconductor layer 23, the present invention is not limited thereto. That is, the first and second electrode pads may be partially positioned on the second conductive type semiconductor layer 27.

The insulating reflective layer 31 is positioned between the second electrode pad 33 and the first conductive type semiconductor layer 23 to insulate the second electrode pad 33 from the first conductive type semiconductor layer 23. Further, the insulating reflective layer 31 covers a portion of the mesa side surfaces to prevent the second electrode pad 33 from being in contact with the second conductive type semiconductor layer 27 or the active layer 25.

Meanwhile, the upper extensions 33a are positioned on the second conductive type semiconductor layer 27 (or the transparent electrode layer 29). The upper extensions 33a may be connected to the second electrode pad 33 through the connection portions 33b, respectively. The upper extensions 33a are electrically connected to the second conductive type semiconductor layer 27 (or the transparent electrode layer 29). The upper extensions 33a may be is connected to the transparent electrode layer 29 through the respective openings 32a of the insulating layer 32. The upper extensions 33a are disposed to allow current to be equally distributed in the first conductive type semiconductor layer 23. In the meantime, the connection portions 33b are spaced apart from the second conductive type semiconductor layer 27 and the active layer 25 by the insulating reflective layer 31 and/or the insulating layer 32.

Meanwhile, at least one lower extension 35a may extend from the first electrode pad 35. The lower extension 35a is positioned on the first conductive type semiconductor layer 23 and electrically connected to the first conductive type semiconductor layer 23. Although the lower extension 35a may be positioned between the divided light emitting areas, the present invention is not limited thereto. That is, the lower extension may be positioned outside of the light emitting areas, such as the lower extension 35b.

The electrode pads 33 and 35, the upper extensions 33a, the connection portions 33b and the lower extension 35a and 35b may be formed together of the same metallic material, e.g., Cr/Au, by the same process, but the present invention is not limited thereto. For example, the upper extensions 33a and the second electrode pad 33 may be formed through separate processes, and may be formed of different materials from each other.

In this embodiment, the divided light emitting areas are symmetric with respect to a line that connects the first and second electrode pads 35 and 33, e.g., line B-B. The upper is extensions 33a are also disposed to be symmetric, so that the light emitting areas can have the same light emitting characteristic. Thus, as compared with two conventional LEDs which are used to be connected in parallel to each other, the inventive LED having two divided light emitting areas may be used to simplify a packaging process of the LED. Moreover, the divided light emitting areas makes it possible to prevent current from being concentrated by a defect. Also, the inclined sides are formed by the mesa etching process, so that it is possible to increase light extraction efficiency.

In this embodiment, the second electrode pad 33 is positioned on the first conductive type semiconductor layer 23 exposed by mesa-etching and the insulating reflective layer 31 is interposed therebetween. Such a structure prevents light from being generated under the second electrode pad 33 and allows light to be generated in a region except the region in which the second electrode pad 33 is formed, whereby effectively use current. However, the present invention is not limited thereto. For example, the substrate may be exposed by further removing the first conductive type semiconductor layer 23 exposed by the mesa etching process. The insulating reflective layer 31 may be formed on the substrate 21, and the second electrode pad 33 may be disposed on the insulating reflective layer. Alternatively, the second electrode pad 33 may be disposed on the insulating reflective layer 31 so that it is interposed between the second electrode pad 33 and the second conductive type semiconductor layer 27 or the is transparent electrode layer 29.

Figure 3:
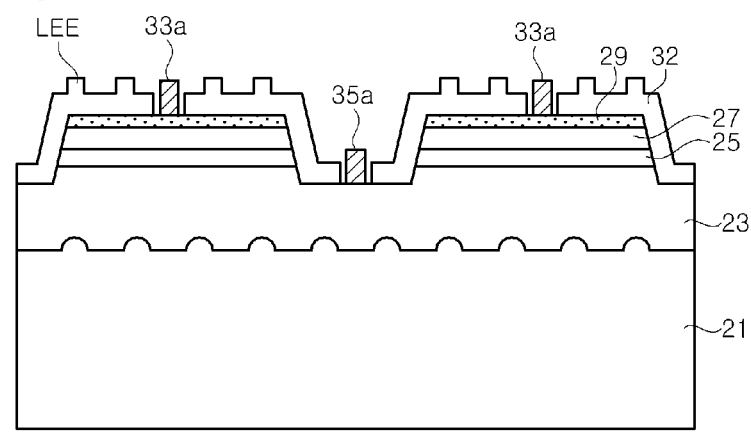
FIG. 3 is a sectional view illustrating an LED according to another embodiment of the present invention, which corresponds to the sectional view of FIG. 2c taken along line C-C of FIG. 1.

FIG. 3 is a sectional view illustrating an LED according to another embodiment of the present invention, which corresponds to the sectional view of FIG. 2c taken along line C-C of FIG. 1.

Referring to FIG. 3, the LED according to this embodiment is almost similar to the LED previously described, and therefore, only differences will be described in order to avoid overlapping.

In case of the LED previously described with reference to FIGS. 1 and 2a to 2c, the pattern of the light extraction elements LEE is positioned on the transparent electrode layer 29. On the other hand, in the LED according to this embodiment, the pattern of the light extraction elements LEE is positioned on the insulating layer 32. The light extraction elements LEE may be formed by partially patterning an upper portion of the insulating layer 32, or may be formed by forming another material layer on the insulating layer 32 and then patterning the material layer. The light extraction elements LEE may be in the shape of a cylinder having a diameter of 5 μm, and spaced apart from one another at an interval of about 30 μm, for example.

Figure 4:
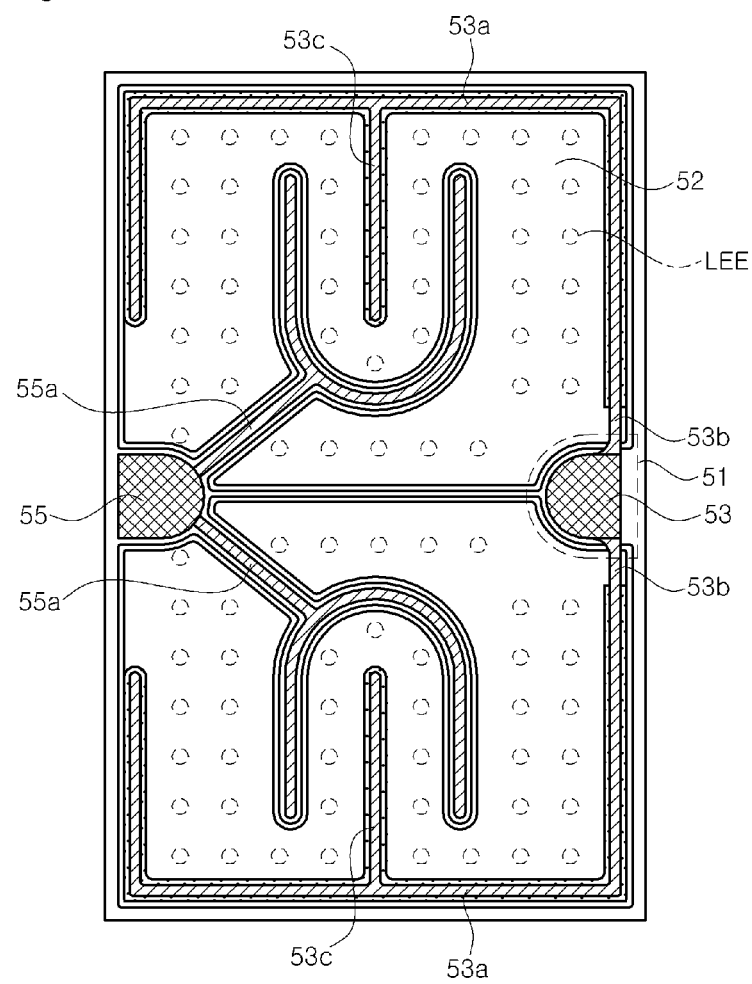
FIG. 4 is a plan view illustrating an LED according to a further embodiment of the present invention.

FIG. 4 is a plan view illustrating an LED according to a further embodiment of the present invention.

In the embodiment of FIG. 1, the first and second electrode pads 35 and 33 are is disposed along a major axis of the LED, and the light emitting areas are divided along the major axis of the LED. However, in this embodiment, electrode pads 53 and 55 are disposed along a minor axis of the LED, and light emitting areas are divided along the minor axis of the LED. The divided light emitting areas have a symmetrical structure, and upper and lower extensions 53a and 55a are also disposed to be symmetric.

An insulating reflective layer 51 is positioned under the second electrode pad 53, as described with reference to FIG. 1, and a pattern of light extraction elements LEE is positioned on a transparent electrode layer or insulating layer 52.

Here, the upper extensions 53a are disposed in the shape to extend along an outer edge of the LED and surround it. Also, each upper extension has an extension 53c to extend from the outer edge the LED to the inside thereof. Meanwhile, the lower extensions 55a extend outwards from the inside of the LED. Each of the lower extensions 55a may be divided into two branches to surround the extension 53c in each light emitting area.

The upper extensions 55a are connected to the second electrode pad 53 by connection portions 53b.

Figure 5:
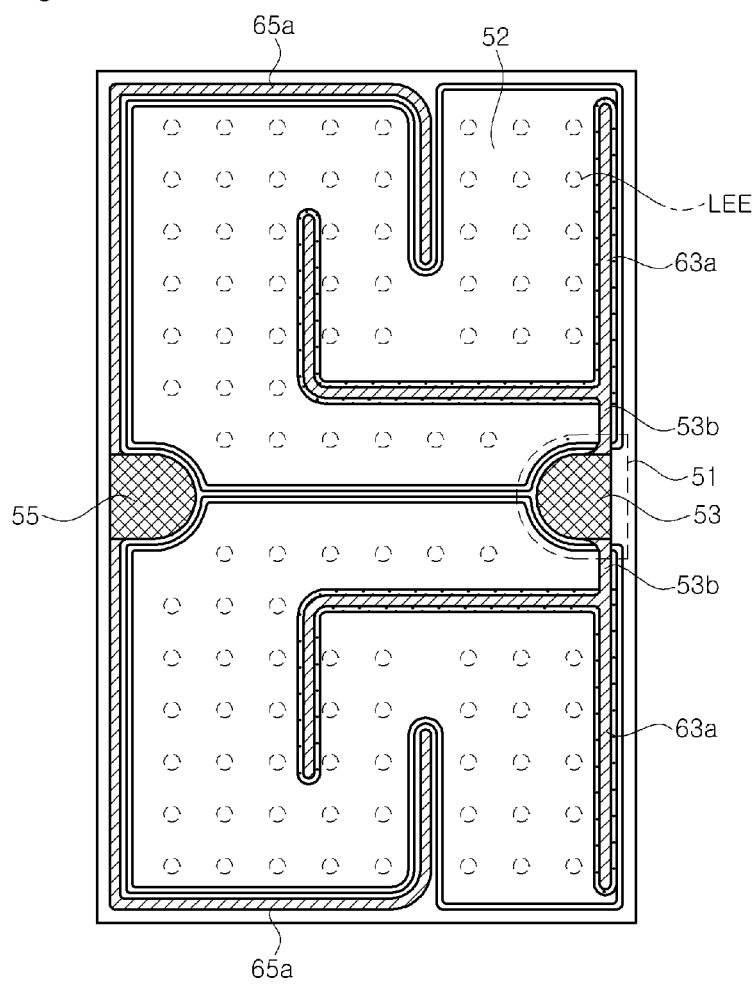
FIG. 5 is a plan view illustrating an LED according to a still further embodiment of the present invention.

FIG. 5 is a plan view illustrating an LED according to a still further embodiment of the present invention.

Referring to FIG. 5, the LED according to this embodiment is almost similar to is the LED described with reference to FIG. 4, but different in the arrangement of lower and upper extensions 65a and 63a.

That is, the lower extensions 65a extend along an outer edge of the LED and then toward the inside of light emitting areas. Each upper extension 63a has two extensions on each light emitting area, wherein the two extensions are disposed to surround the lower extension 65a which extends toward the inside of the light emitting area.

Some embodiments of the present invention have been described above, but the arrangement of the electrode pads and the extensions may be variously modified and changed. Although the LED divided into the two light emitting areas has been described as an example, it may be divided into a larger number of light emitting areas.

The invention claimed is:

1. A light emitting diode (LED), comprising:
   a substrate;
   a light emitting structure disposed on the substrate, the light emitting structure comprising a first semiconductor layer, an active layer, and a second semiconductor layer;
   a first electrode pad electrically connected to the first semiconductor layer;
   a second electrode pad disposed on the substrate;
   an insulating reflective layer covering a portion of the light emitting structure, the insulating reflective layer disposed under the second electrode pad so that the second electrode pad is spaced apart from the light emitting structure by the insulating reflective layer;
   an upper extension connected to the second electrode pad, the upper extension electrically connected to the second semiconductor layer;
   light extraction elements arranged in a pattern and disposed on the second semiconductor layer;
   a transparent electrode layer disposed on the second semiconductor layer; and an insulating layer covering the transparent electrode layer, wherein:

the insulating layer comprises an opening exposing the transparent electrode layer, and the upper extension is connected to the transparent electrode layer through the opening; and the first semiconductor layer comprises an n-type nitride semiconductor layer, and the second semiconductor layer comprises a p-type nitride semiconductor layer.

2. The LED of claim 1, wherein the light extraction elements are disposed on the transparent electrode layer.

3. The LED of claim 1, wherein the opening is spaced apart from the second electrode pad.

4. The LED of claim 1, wherein the light extraction elements are disposed on the insulating layer.

5. A light emitting diode (LED), comprising:

a substrate;

a light emitting structure disposed on the substrate, the light emitting structure comprising a first semiconductor layer, an active layer, and a second semiconductor layer;

a first electrode pad electrically connected to the first semiconductor layer;

a second electrode pad disposed on the substrate;

an insulating reflective layer covering a portion of the light emitting structure, the insulating reflective layer disposed under the second electrode pad so that the second electrode pad is spaced apart from the light emitting structure by the insulating reflective layer;

an upper extension connected to the second electrode pad, the upper extension electrically connected to the second semiconductor layer; and light extraction elements arranged in a pattern and disposed on the second semiconductor layer, wherein the first semiconductor layer comprises an exposed region, the second electrode pad is disposed on the exposed region of the first semiconductor layer, and the insulating reflective layer is disposed between the second electrode pad and the first semiconductor layer and contacts the first semiconductor layer in the exposed region.

6. The LED of claim 5, wherein the insulating reflective layer covers a portion of exposed side surfaces of the second semiconductor layer and the active layer.

7. The LED of claim 5, further comprising a connection portion connecting the upper extension and the second electrode pad, wherein the connection portion is spaced apart from the second semiconductor layer by the insulating layer.

8. A light emitting diode (LED), comprising:

a substrate;

a light emitting structure disposed on the substrate, the light emitting structure comprising a first semiconductor layer, an active layer, and a second semiconductor layer;

a first electrode pad electrically connected to the first semiconductor layer;

a second electrode pad disposed on the substrate;

an insulating reflective layer covering a portion of the light emitting structure, the insulating reflective layer disposed under the second electrode pad so that the second electrode pad is spaced apart from the light emitting structure by the insulating reflective layer;

a first upper extension and a second upper extension connected to the second electrode pad, the first upper extension and the second upper extension electrically connected to the second semiconductor layer; and light extraction elements arranged in a pattern and disposed on the second semiconductor layer;

transparent electrode layers respectively disposed on the second semiconductor layer in each of the first light emitting area and the second light emitting area; and an insulating layer covering the transparent electrode layers, wherein:

the second semiconductor layer and the active layer comprise a first light emitting area and a second light emitting area;

the first upper extension and the second upper extension are electrically connected to the second semiconductor layer and disposed on the first light emitting area and the second light emitting area;

the first upper extension and the second upper extension are connected to the transparent electrode layers, respectively; and the insulating layer comprises openings exposing the transparent electrode layers, and the first upper extension and the second upper extension are respectively connected to one of the transparent electrode layers through the openings.

9. The LED of claim 8, wherein the first light emitting area and the second light emitting area are symmetric with respect to a straight line bisecting the first electrode pad and the second electrode pad.

10. The LED of claim 8, further comprising at least one lower extension connected to the first electrode pad, wherein the at least one lower extension is disposed between the first light emitting area and the second light emitting area.

11. The LED of claim 8, wherein the light extraction elements are disposed on the transparent electrode layers.

12. The LED of claim 8, wherein the light extraction elements are disposed on the insulating layer.

* * * * *